United States Patent
Huang (10) Patent No.: US 12,034,401 B2
(45) Date of Patent: Jul. 9, 2024

(54) LAP JOINT PLATE WITH SOLAR PANEL

(71) Applicant: CHIAO KUO ENERGY TECHNOLOGY CO., LTD., Caotun (TW)

(72) Inventor: Ming-Li Huang, Caotun (TW)

(73) Assignee: CHIAO KUO ENERGY TECHNOLOGY CO., LTD., Caotun (TW)

( * ) Notice: Subject to any disclaimer, the term of this patent is extended or adjusted under 35 U.S.C. 154(b) by 0 days.

(21) Appl. No.: 17/986,402

(22) Filed: Nov. 14, 2022

(65) Prior Publication Data

US 2023/0299712 A1     Sep. 21, 2023

(30) Foreign Application Priority Data

Mar. 15, 2022  (TW) .................................. 111109366
Mar. 15, 2022  (TW) ................................. 111202542
Mar. 23, 2022  (JP) ................................. 2022-47272

(51) Int. Cl.
*H02S 30/10*         (2014.01)
*H02S 40/22*         (2014.01)
*H02S 40/34*         (2014.01)

(52) U.S. Cl.
CPC .............. *H02S 30/10* (2014.12); *H02S 40/22* (2014.12); *H02S 40/34* (2014.12)

(58) Field of Classification Search
CPC ... H01L 31/048; H01L 31/049; H01L 31/054; H02S 20/23; H02S 30/10; H02S 40/22; H02S 40/34
See application file for complete search history.

(56) References Cited

U.S. PATENT DOCUMENTS

2004/0246596 A1* 12/2004 Dyson ..................... H02S 40/22
                                                                 359/742

FOREIGN PATENT DOCUMENTS

| AU | 2016259319 A1 | * | 12/2016 | ............. Y02E 10/50 |
| JP | 2000101124 A  | * | 4/2000  | ....... B32B 17/10018 |
| JP | 2010236270 A  | * | 10/2010 | ............. F24J 2/4614 |

* cited by examiner

*Primary Examiner* — Golam Mowla
(74) *Attorney, Agent, or Firm* — J.C. PATENTS (57) ABSTRACT

This invention relates to an innovative lap joint plate with solar panel, which includes at least a lap joint plate and a solar chip set as main components combined together. Said lap joint plate is provided with at least one flat portion and a plurality of protruding portions, said flat portion is arranged between adjacent two protruding portions, the height of said protruding portions are all higher than said flat portion. Said solar chip set is arranged above said flat portion. The present invention can effectively prevent the solar chip set from being damaged by the bending and twisting of the lap joint plate by using the flexible solar chip set. Alternatively, a glass plate can be added to the outermost layer (and the bottom layer) of the solar chip set, the hardness of the glass plate is used to support and protect the solar chip set, so that the solar chip set can be prevented from being damaged by the deformation and stretching of the lap joint plate.

1 Claim, 11 Drawing Sheets

FIG 28

LAP JOINT PLATE WITH SOLAR PANEL

CROSS-REFERENCE TO RELATED APPLICATION

This application claims priority to Taiwan application No. 111109366, filed on Mar. 15, 2022, Taiwan application No. 111202542, filed on Mar. 15, 2022, and Japan application No. 2022-47272, filed on Mar. 23, 2022, the contents of the above identified applications are hereby incorporated by reference in its entirety and made a part of this specification.

BACKGROUND OF THE INVENTION

1. Field of the Invention

This invention relates to a construction lap joint plate, particularly to a new lap joint plate structure which can be made by at least one solar chip set and various construction lap joint plate.

2. Description of the Prior Art

Conventional solar panel is provided with a solar chip set between two layers of glass, and then frame the periphery of the glass with a metal frame to prevent the solar chip set from being damaged by external forces or moisture. When the conventional solar panel is to be installed, it must be pre-installed with a bracket system or a rail-type bracket at the installation site, and then the conventional solar panels are installed and fixed on the brackets one by one, so the conventional solar panels cannot be directly connected to each other by fasteners such as screws, which will cause each solar panel to independently withstand wind pressure.

In open areas or on top of building roofs, which are easily hit by strong winds, conventional solar panels are very easy to be blown away, which will lead to interruption of solar power generation, and the blown solar panels will also cause harm to the surrounding environment, and even lead to casualties and heavy losses.

Furthermore, since the conventional solar panel has a height difference between the edge position of the upper glass and the metal frame, dirt such as furring, dust, bird droppings, etc. will quickly accumulate on the edge of the upper glass, so that sunlight is blocked by the dirt, which affects the power generation efficiency.

The inventor has found after a long period of practice that the lap joint plate made of metal has better ductility and thermal expansion characteristics, and has obvious physical properties different from the solar chip set.

If two materials with different ductility and thermal expansion characteristics are fixed together, when the user are handling and assembling, the lap joint plate is easily bent and twisted, this will cause the solar chip set to be easily damaged by the deformation and stretching of the lap joint plate, which will easily cause defects in the product, affect the overall solar power generation efficiency, and increase the maintenance cost.

For this reason, the inventor of this invention, having much experience in the development and manufacturing of solar panels and metal building materials, understands and researches the problem of the foregoing conventional solar panel and hence devised this invention.

SUMMARY OF THE INVENTION

The purpose of the present invention is to provide a lap joint plate structure that can be lapped into one stable structure and can effectively protect the solar chip set. The invention breaks through the limitation that the conventional solar panel must be arranged between two glass plates and a frame, and the technical prejudice that the conventional solar panel is made of a frame-type plate, and effectively solves the problem that the conventional solar panels cannot combine and fix adjacent solar panels to each other, so that all the solar panels can be connected to each other and assembled into an integrated structure to improve the wind pressure resistance.

the present invention can effectively prevent the solar chip set from being damaged by bending and twisting of the lap joint plate by using the flexible solar chip set. Alternatively, in the present invention, a glass plate can be added to the outermost layer (and the bottom layer) of the solar wafer group, and the hardness of the glass plate can be used to support and protect the solar wafer group, so that the solar chip set can be prevented from being deformed and stretched by the lap joint plate. The glass plate has the characteristics of high light transmission, corrosion resistance, not easy to adhere to dirt, and easy to clean (the lap joint plate can concentrate the rainwater to wash the surface of the glass plate), so that the solar chip set can generate electricity stably in any environment.

In this way, the structural strength of each lap joint plate with solar panel can be definitely improved, and a plurality of lap joint plates with solar panel can be quickly assembled and lapped into an integrated structure to achieve the purpose of reducing manufacturing cost and improving structural strength, wind pressure resistance and installation speed.

The lap joint plate with solar panel in the present invention includes at least a lap joint plate and a solar chip set. Said lap joint plate is provided with at least one flat portion and a plurality of protruding portions, said flat portion is arranged between adjacent two protruding portions, the height of said protruding portions are all higher than said flat portion. Said solar chip set is arranged above said flat portion, said solar chip set is provided with a control box and a plurality of output wires, said control box is connected to said solar chip set; an insulating layer is provided between said solar chip set and the flat portion of said lap joint plate, said insulating layer is respectively stuck to the bottom of said solar chip set and the top of said flat portion, a light-concentrating layer is arranged above said solar chip set, the bottom of said light-concentrating layer is stuck to the top of said solar chip set, a plurality of light-concentrating grooves are arranged above said light-concentrating layer. A glass plate is arranged above said light-concentrating layer, the area of said glass plate is larger than the area of said solar chip set and light-concentrating layer, said solar chip set and light-concentrating layer are located in the center of said glass plate, and the bottom of said glass plate is stuck to the top of said light-concentrating layer; a sealant is arranged between the outer periphery of said glass plate and the flat portion of said lap joint plate, said sealant makes said glass plate and the flat portion of said lap joint plate adhere to each other, and said sealant seals said solar chip set and light-concentrating layer between said glass plate and insulating layer.

The lap joint plate with solar panel of the present invention, among which a light-concentrating layer can be arranged between said solar chip set and glass plate, a plurality of light-concentrating grooves are arranged above said light-concentrating layer, said light-concentrating grooves enable obliquely irradiated sunlight to be concentrated on said solar chip set, so as to improve the amount of sunlight and solar energy conversion efficiency of said solar chip set.

The lap joint plate with solar panel of the present invention, among which said glass plate can be not provided, and said solar chip set is replaced with a flexible solar chip set. A light-concentrating layer is arranged above said flexible solar chip set, and the area of said light-concentrating layer is larger than said flexible solar chip set, and the outer periphery of said light-concentrating layer extends to said flat portion to completely cover said flexible solar chip set. Said flexible solar chip set is sealed between said light-concentrating layer and insulating layer, a plurality of light-concentrating grooves are arranged above said light-concentrating layer.

BRIEF DESCRIPTION OF DRAWINGS

This invention will be better understood by referring to the accompanying drawings, wherein.

DETAILED DESCRIPTION OF THE PREFERRED EMBODIMENT

Figure 1:
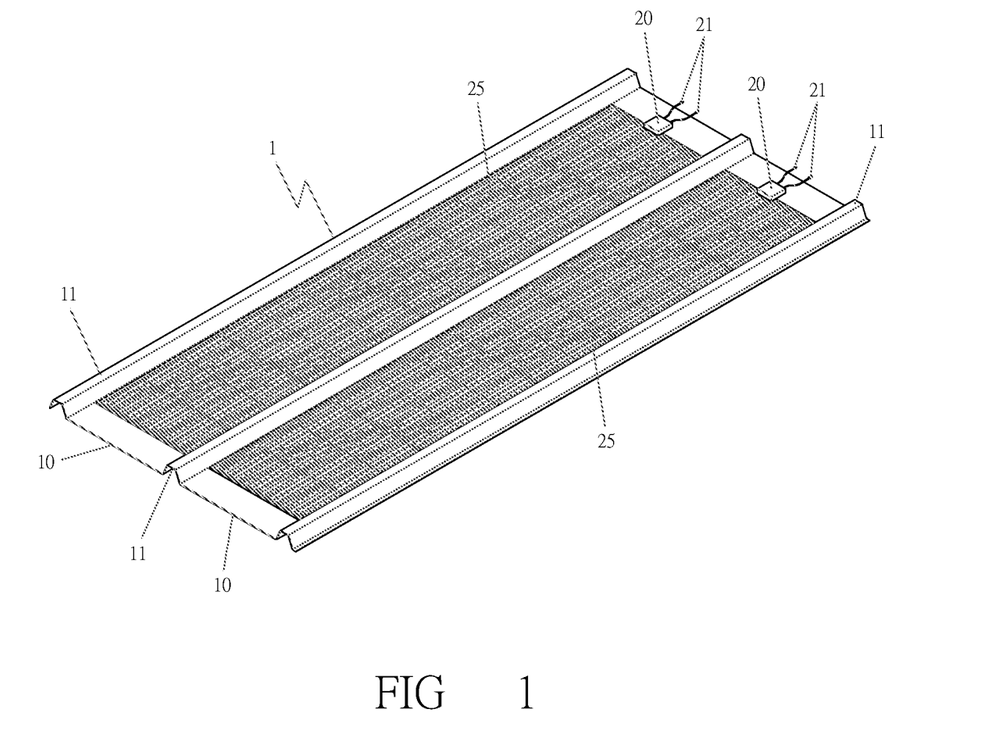
FIG. 1 is a perspective view of a first embodiment of a lap joint plate with solar panel of the present invention.
Figure 2:
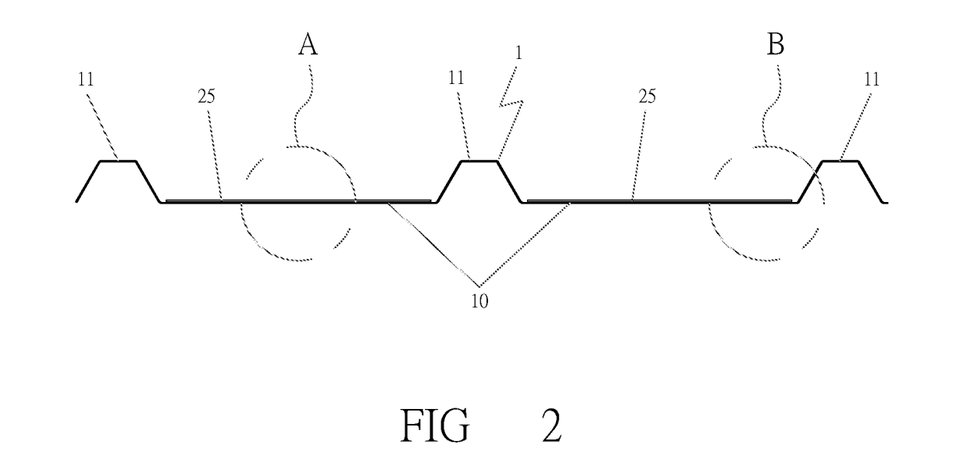
FIG. 2 is a front view of FIG. 1.
Figure 3:
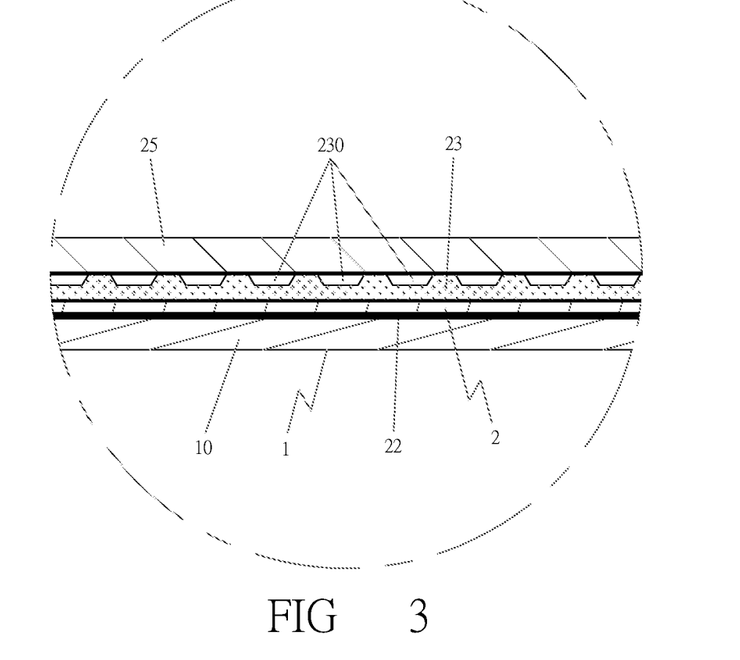
FIG. 3 is an enlarged view of area A of FIG. 2.
Figure 4:
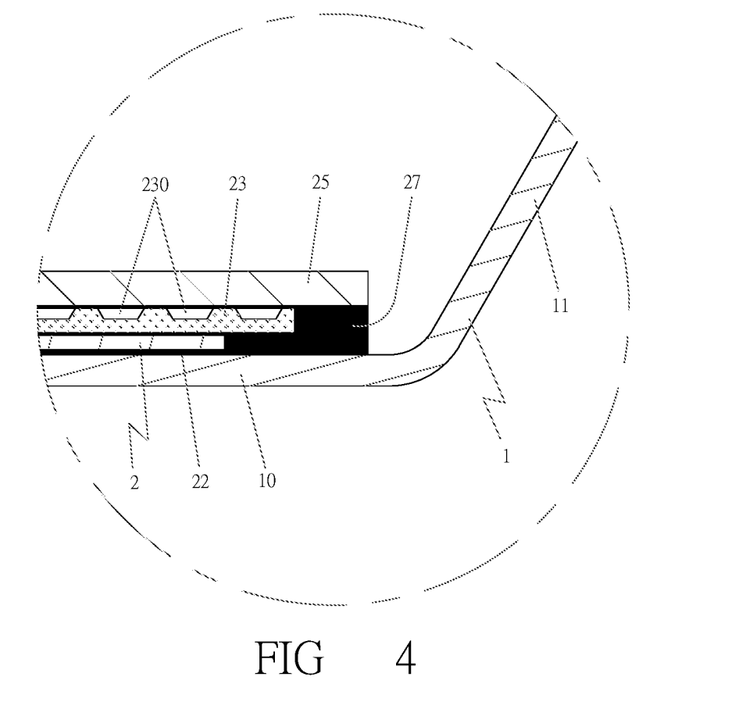
FIG. 4 is an enlarged view of area B of FIG. 2.
Figure 5:
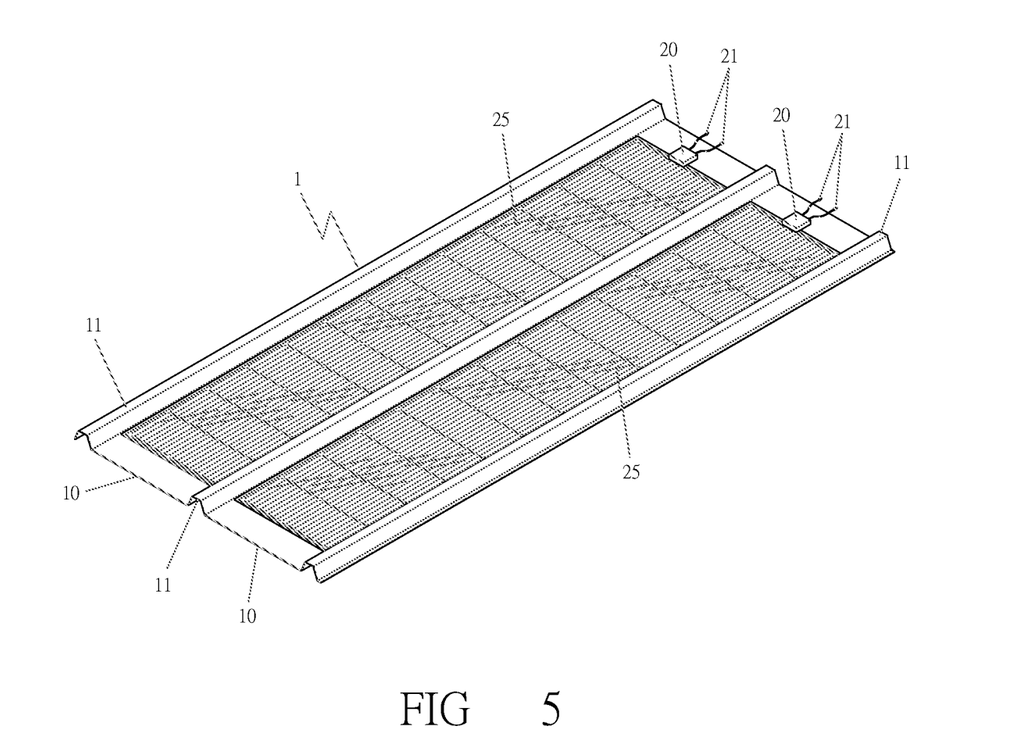
FIG. 5 is a perspective view of a second embodiment of a lap joint plate with solar panel of the present invention.
Figure 6:
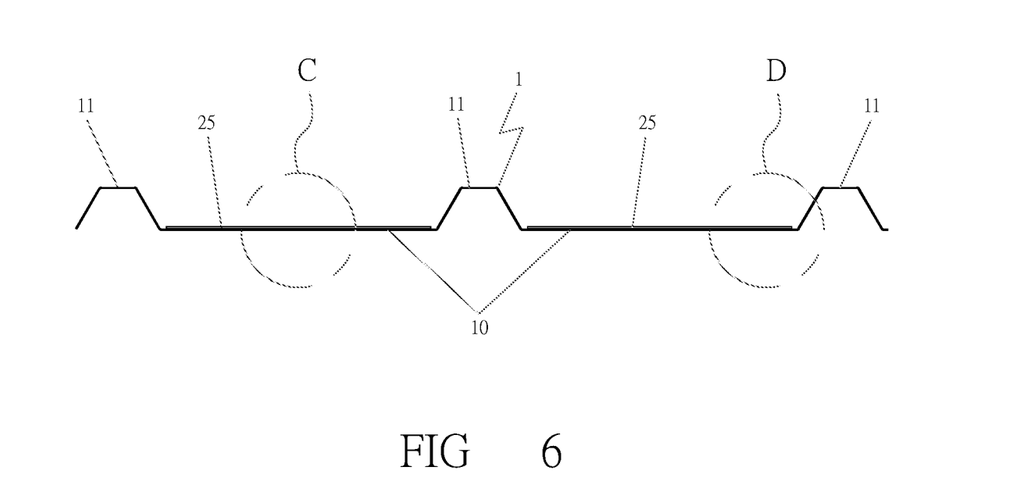
FIG. 6 is a front view of FIG. 5.
Figure 7:
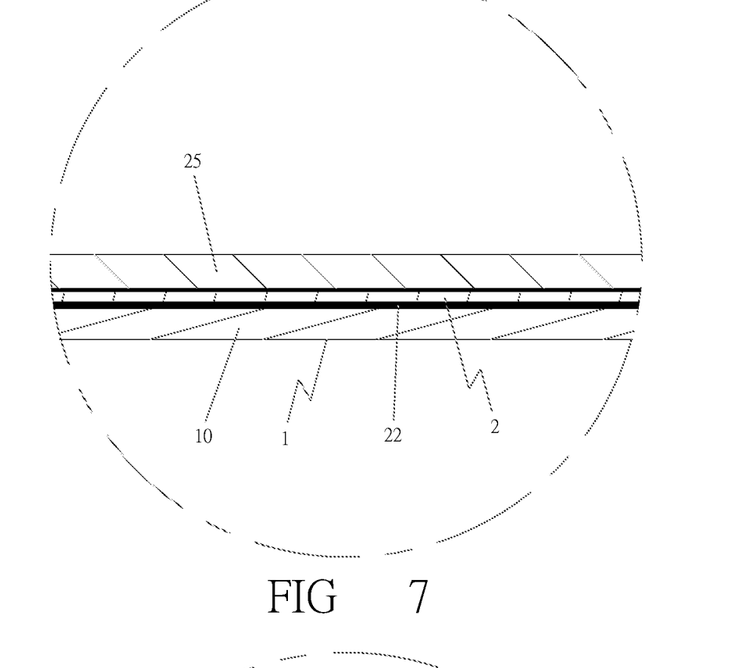
FIG. 7 is an enlarged view of area C of FIG. 6.
Figure 8:
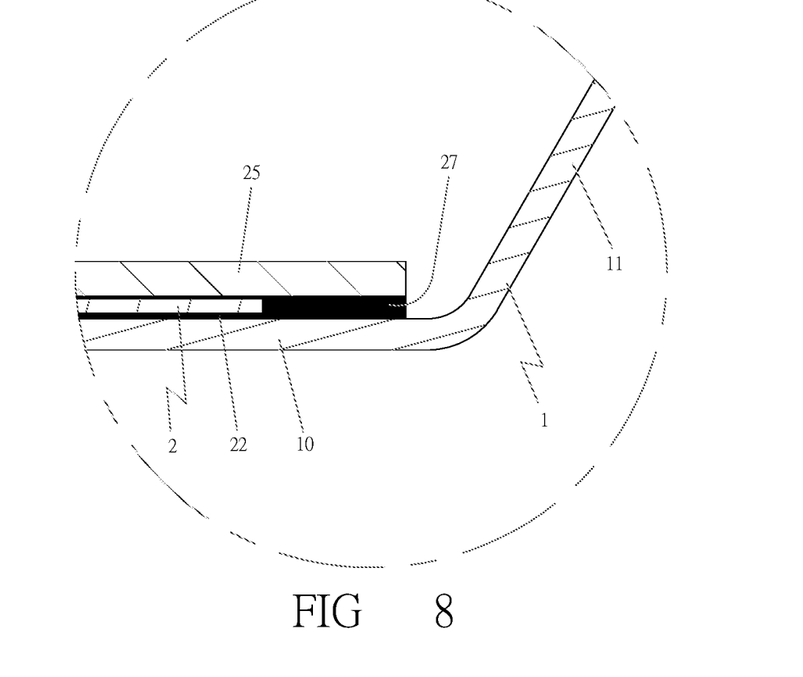
FIG. 8 is an enlarged view of area D of FIG. 6.
Figure 9:
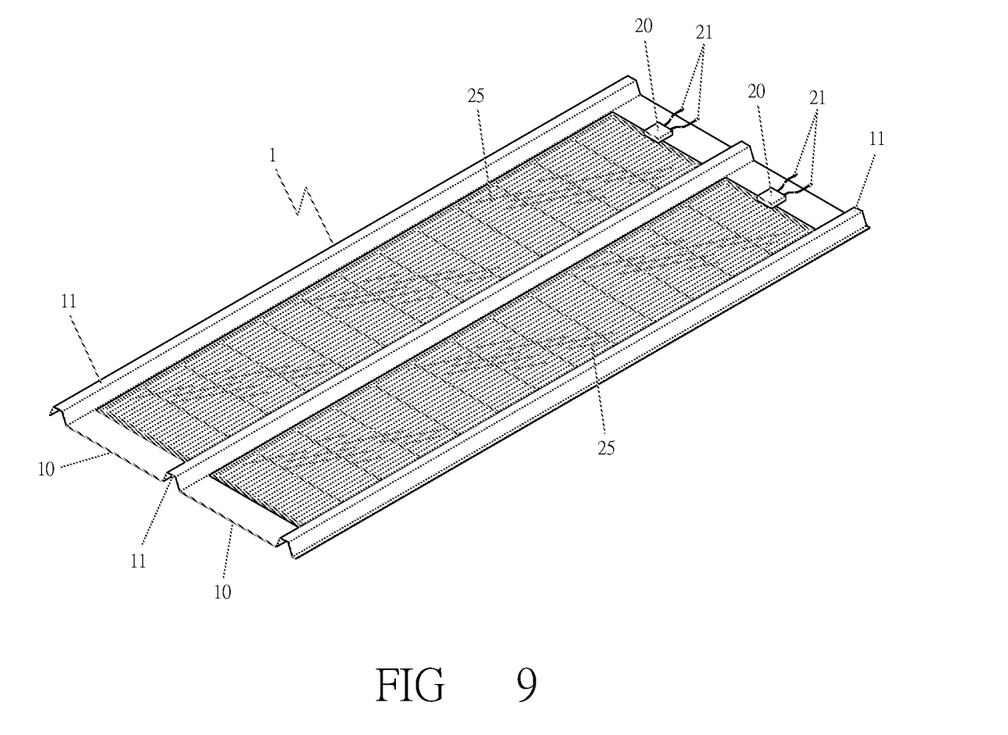
FIG. 9 is a perspective view of a third embodiment of a lap joint plate with solar panel of the present invention.
Figure 10:
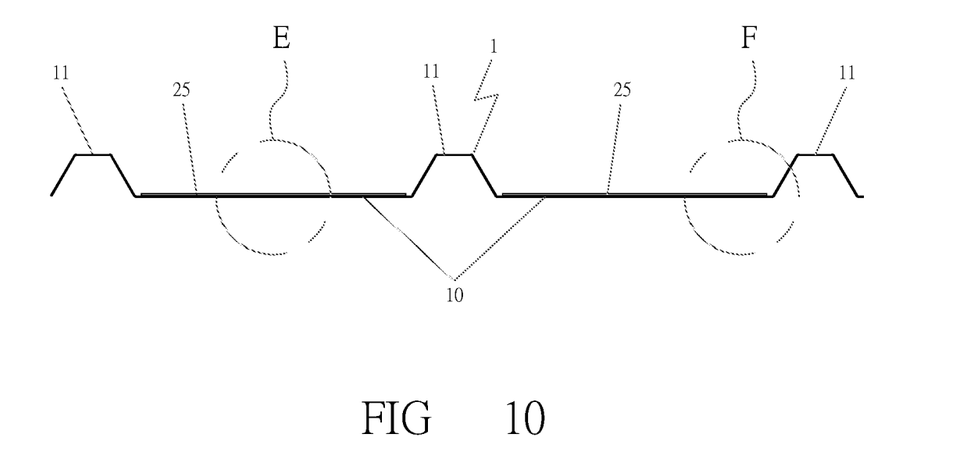
FIG. 10 is a front view of FIG. 9.
Figure 11:
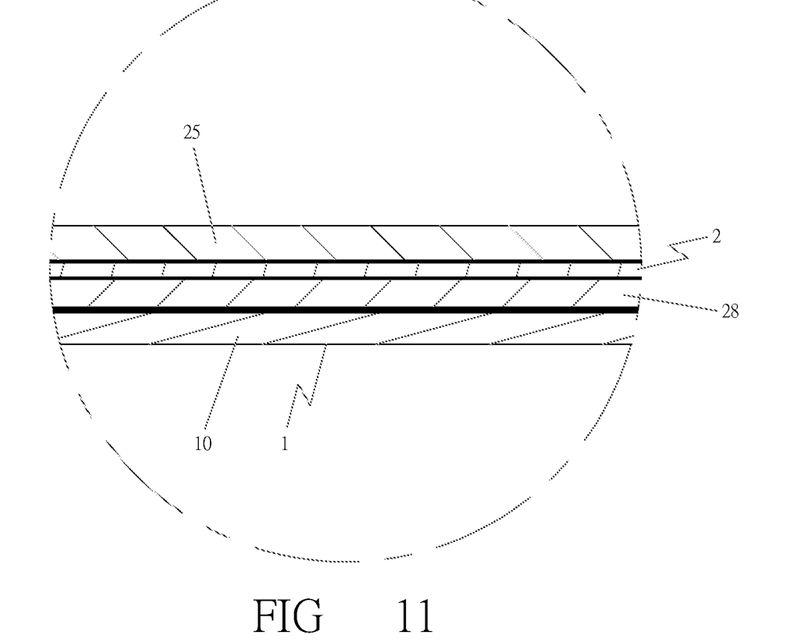
FIG. 11 is an enlarged view of area E of FIG. 10.
Figure 12:
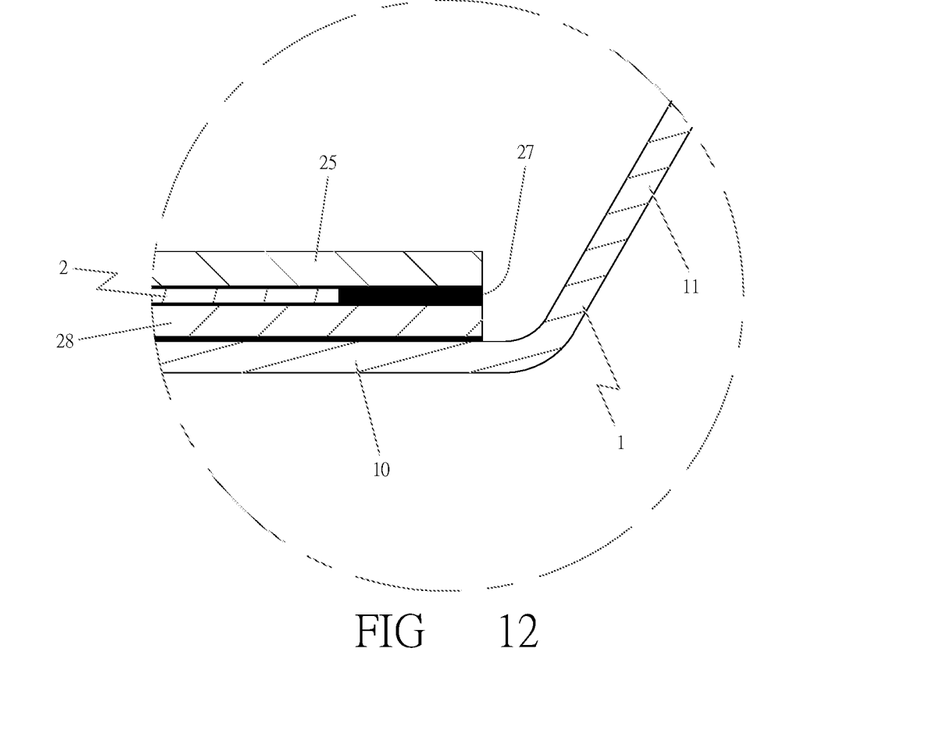
FIG. 12 is an enlarged view of area F of FIG. 10.
Figure 13:
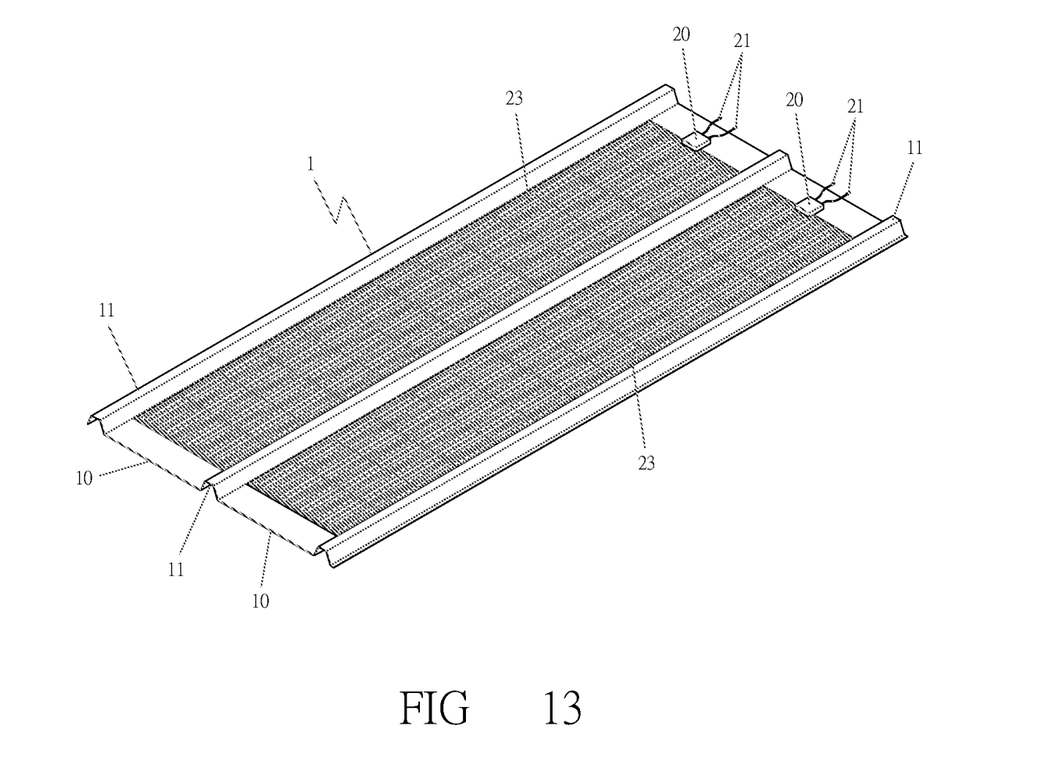
FIG. 13 is a perspective view of a fourth embodiment of a lap joint plate with solar panel of the present invention.
Figure 14:
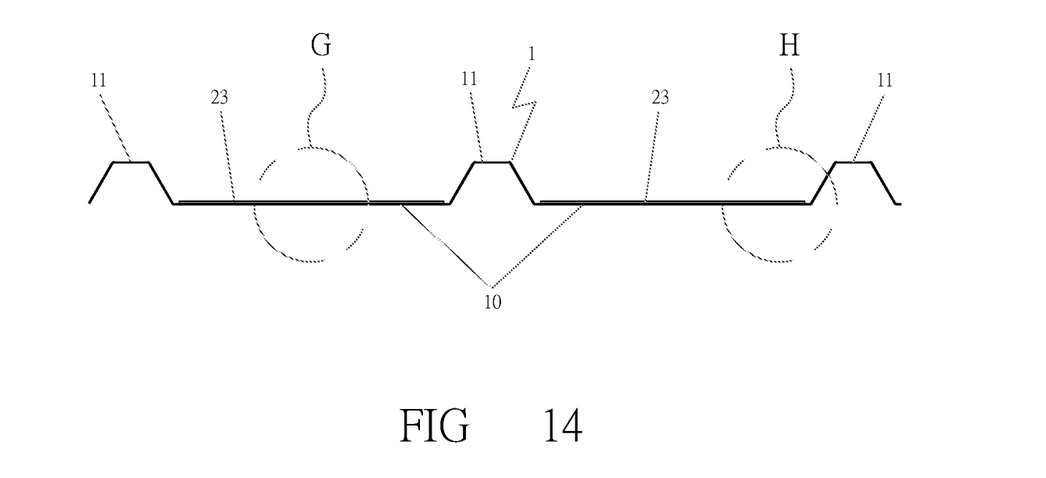
FIG. 14 is a front view of FIG. 13.
Figure 15:
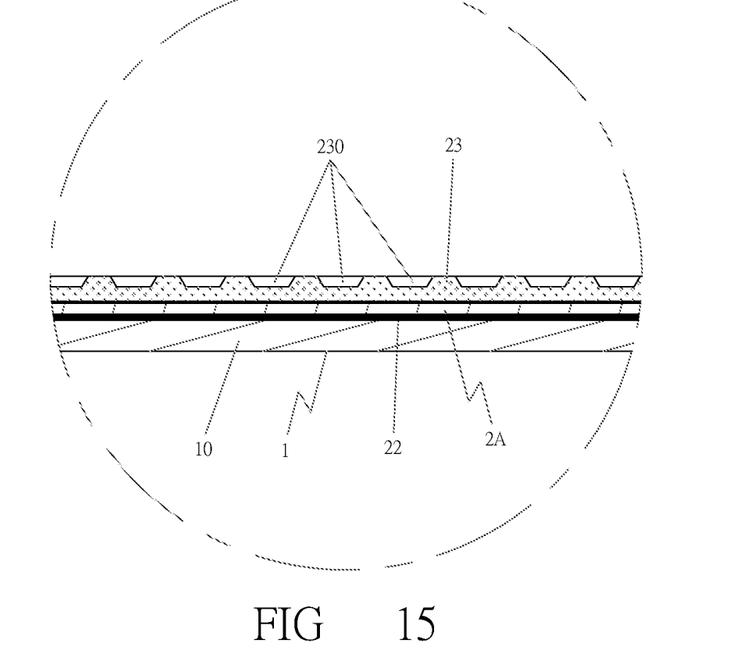
FIG. 15 is an enlarged view of area G of FIG. 14.
Figure 16:
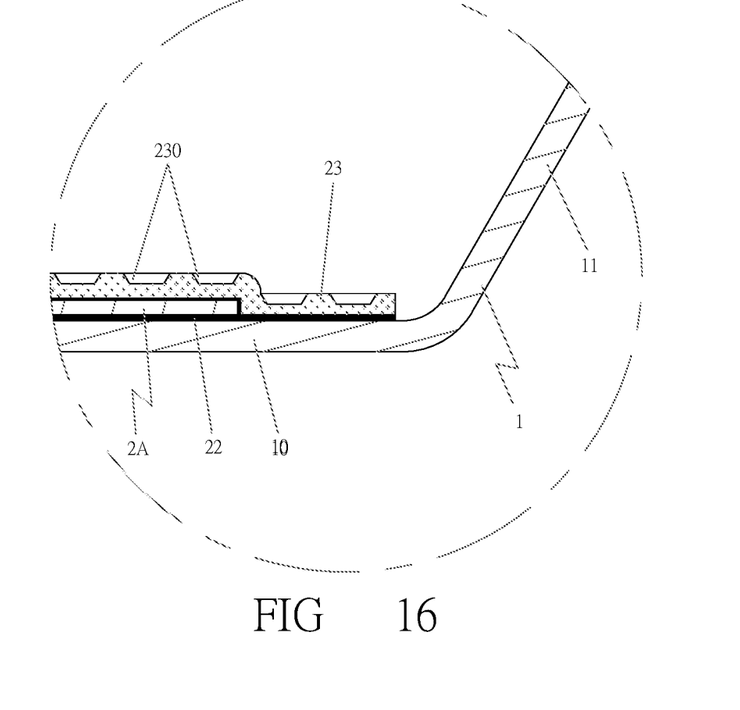
FIG. 16 is an enlarged view of area H of FIG. 14.
Figure 17:
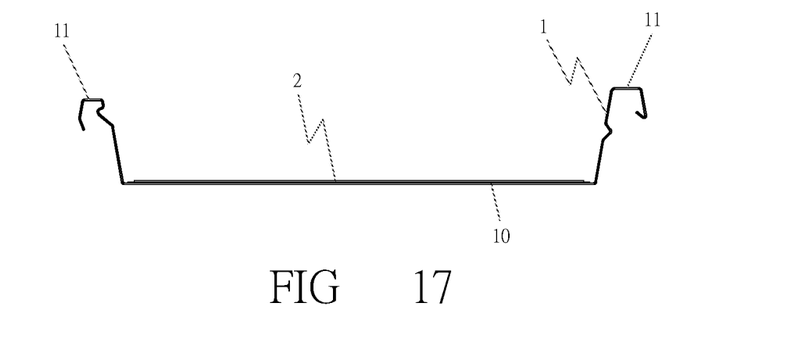
FIG. 17 is a front view of the first embodiment of the lap joint plate of the present invention.
Figure 18:
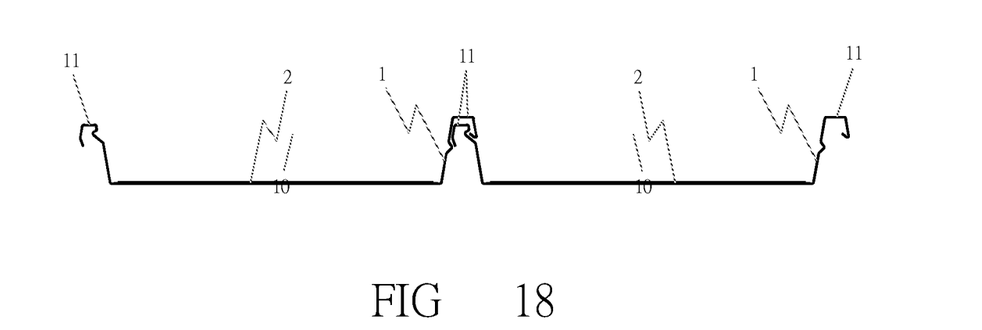
FIG. 18 is a schematic view of the assembly of FIG. 17.
Figure 19:
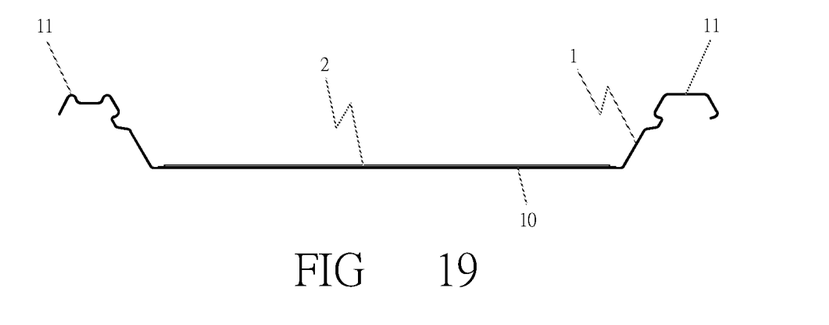
FIG. 19 is a front view of the second embodiment of the lap joint plate of the present invention.
Figure 20:
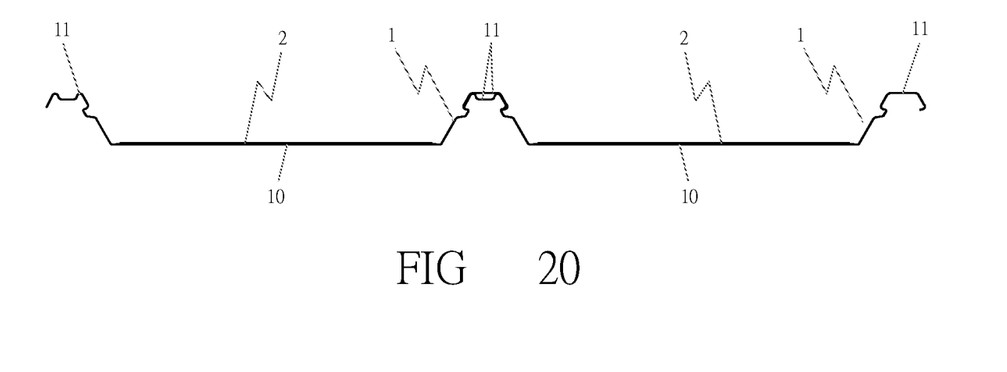
FIG. 20 is a schematic view of the assembly of FIG. 19.
Figure 21:
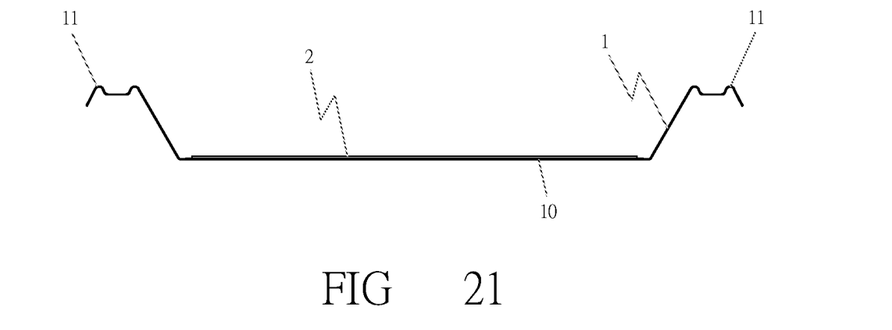
FIG. 21 is a front view of the third embodiment of the lap joint plate of the present invention.
Figure 22:
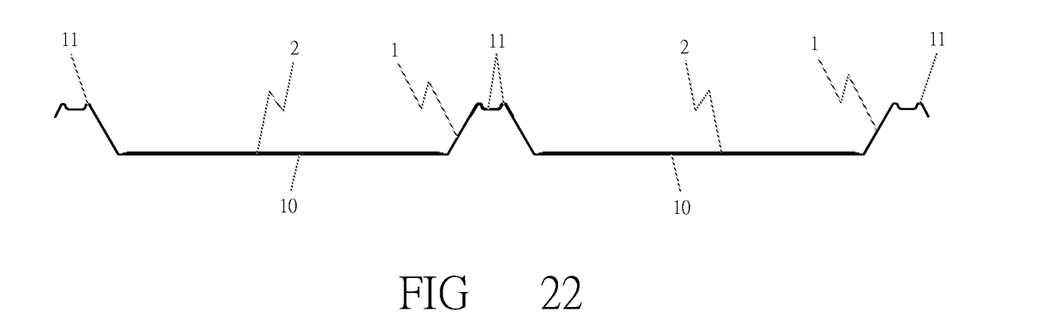
FIG. 22 is a schematic view of the assembly of FIG. 21.
Figure 23:
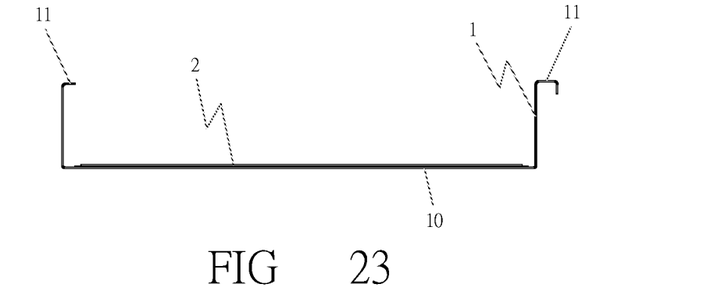
FIG. 23 is a front view of the fourth embodiment of the lap joint plate of the present invention.
Figure 24:
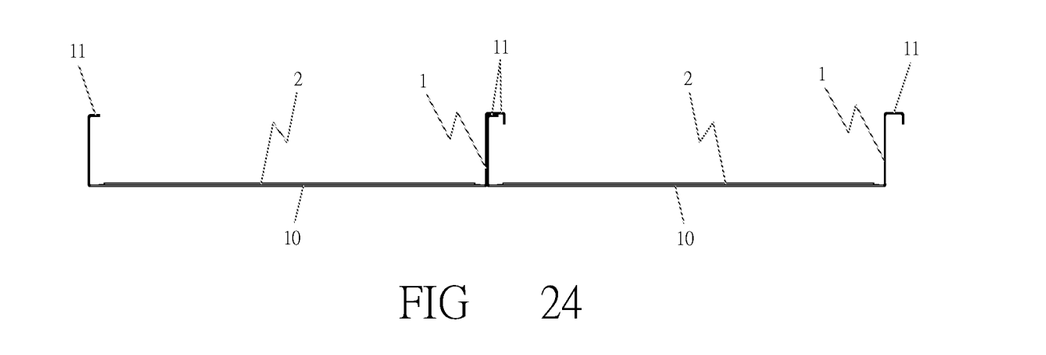
FIG. 24 is a schematic view of the assembly of FIG. 23.
Figure 25:
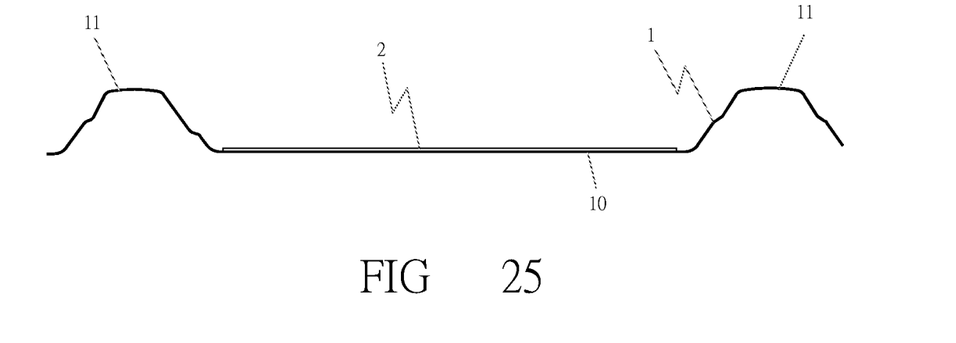
FIG. 25 is a front view of the fifth embodiment of the lap joint plate of the present invention.
Figure 26:
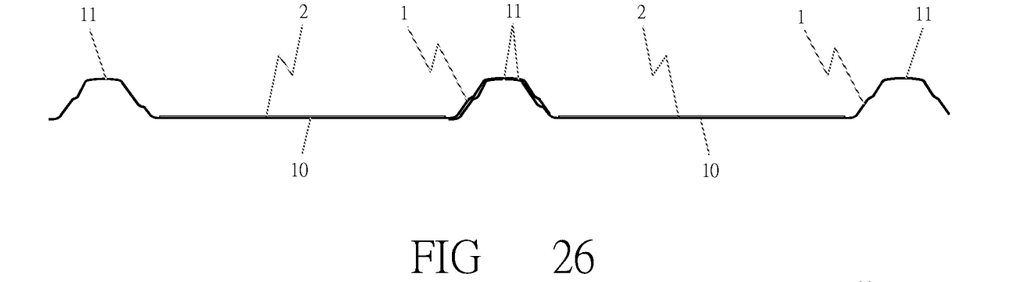
FIG. 26 is a schematic view of the assembly of FIG. 25.
Figure 27:
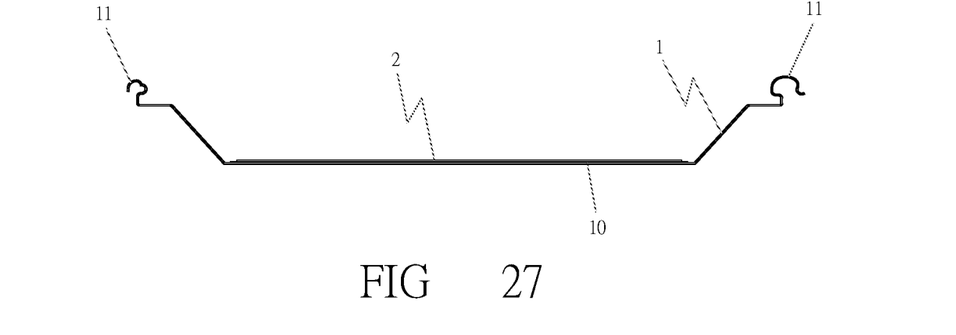
FIG. 27 is a front view of the sixth embodiment of the lap joint plate of the present invention.
Figure 28:
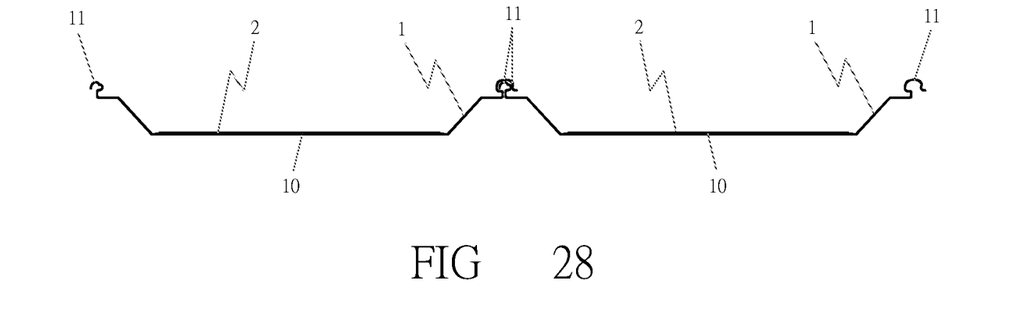
FIG. 28 is a schematic view of the assembly of FIG. 27.

The lap joint plate with solar panel in the present invention, as shown in FIGS. 1 to 28 includes at least a lap joint plate 1 and a solar chip set 2 as main components combined together.

Said lap joint plate 1 is provided with at least one flat portion 10 and a plurality of protruding portions 11, said flat portion 10 is arranged between adjacent two protruding portions 11, and the two protruding portions 11 located at both ends of said lap joint plate 1 can be used to overlap the protruding portions 11 of the adjacent lap joint plates 1, so that said lap joint plate 1 can be infinitely overlapped and extended with adjacent lap joint plates 1. The height of said protruding portions 11 are all higher than said flat portion 10, so that the rainwater can be collected to flow to said flat portion 10 and directly wash said solar chip set 2 above said flat portion 10.

As shown in FIGS. 1 to 4, it is the first embodiment of the present invention. Said solar chip set 2 is arranged above said flat portion 10, said solar chip set 2 may be various solar chip set. Said solar chip set 2 is provided with a control box 20 and a plurality of output wires 21, said control box 20 is connected to said solar chip set 2 and collects the electricity generated by said solar chip sets 2, the output lines 21 of said adjacent solar chip sets 2 are connected to each other, so that all the solar chip sets 2 can be connected in series, and the electric energy generated by the solar chip sets 2 can be output to an external electrical equipment or an electricity storage equipment. An insulating layer 22 is provided between said solar chip set 2 and the flat portion 10 of said lap joint plate 1, for example said insulating layer 22 may be a rubber film or a plastic film with thermal insulation and electrical insulation functions. Said insulating layer 22 is respectively stuck to the bottom of said solar chip set 2 and the top of said flat portion 10 to avoid direct contact between said solar chip set 2 and flat portion 10 and protect said solar chip set 2.

A light-concentrating layer 23 is arranged above said solar chip set 2, the bottom of said light-concentrating layer 23 is stuck to the top of said solar chip set 2, and said light-concentrating layer 23 may be made of various high light transmission materials. A plurality of light-concentrating grooves 230 are arranged above said light-concentrating layer 23, said light-concentrating grooves 230 make the sunlight irradiated obliquely concentrated on said solar chip set 2 to improve the amount of sunlight and solar energy conversion efficiency of said solar chip set 2.

A glass plate 25 is arranged above said light-concentrating layer 23, the area of said glass plate 25 is larger than the area of said solar chip set 2 and light-concentrating layer 23, said solar chip set 2 and light-concentrating layer 23 are located in the center of said glass plate 25, and the bottom of said glass plate 25 is stuck to the top of said light-concentrating layer 23. A sealant 27 is arranged between the outer periphery of said glass plate 25 and the flat portion 10 of said lap joint plate 1. Said sealant 27 makes said glass plate 25 and the flat portion 10 of said lap joint plate 1 adhere to each other, so that said glass plate 25 can directly bear the deformation and stretching of said lap joint plate 1, and said glass plate 25 can support and protect the solar chip set 2 below it to prevent said solar chip set 2 from being damaged by the deformation and stretching of said lap joint plate 1. In addition, said sealant 27 seals said solar chip set 2 and light-concentrating layer 23 between said glass plate 25 and insulating layer 22, so said solar chip set 2 can be prevented from contacting with external moisture to prolong the service life of said solar chip set 2 and improve its safety.

It is worth mentioning that said glass plate 25 has better light transmittance and stability than other plastic plates (such as PC boards, etc.), and does not have the problems of deterioration and fogging to affect its light transmittance. Furthermore, since said solar chip set 2 is protected by said glass plate 25, the material selection of said light-concentrating layer 23 is not limited to the material that need to have high heat resistance, cold resistance, electrical insulation, chemical resistance or mechanical properties, so that the manufacturing cost of said light-concentrating layer 23 can be reduced, and the competitiveness can be improved.

As shown in FIGS. 5 to 8, it is the second embodiment of the present invention, the above-mentioned light-concentrating layer 23 may not be provided on said solar chip set 2, so as to achieve the purpose of reducing the manufacturing cost. Said solar chip set 2 is arranged above said flat portion 10, said solar chip set 2 may be various solar chip set. Said solar chip set 2 is provided with a control box 20 and a plurality of output wires 21, said control box 20 is connected to said solar chip set 2 and collects the electricity generated by said solar chip sets 2, the output lines 21 of said adjacent solar chip sets 2 are connected to each other, so that all the solar chip sets 2 can be connected in series, and the electric energy generated by the solar chip sets 2 can be output to an external electrical equipment or an electricity storage equipment. An insulating layer 22 is provided between said solar chip set 2 and the flat portion 10 of said lap joint plate 1, said insulating layer 22 is respectively stuck to the bottom of said solar chip set 2 and the top of said flat portion 10 to avoid direct contact between said solar chip set 2 and flat portion 10, and protect said solar chip set 2.

In the second embodiment, a glass plate 25 is arranged above said solar chip set 2, the area of said glass plate 25 is larger than the area of said solar chip set 2, and said solar chip set 2 is located in the center of said glass plate 25. The bottom of said glass plate 25 is stuck to the top of said solar chip set 2, a sealant 27 is arranged between the outer periphery of said glass plate 25 and the flat portion 10 of said lap joint plate 1, said sealant 27 makes said glass plate 25 and the flat portion 10 of said lap joint plate 1 adhere to each other, so that said glass plate 25 can directly bear the deformation and stretching of said lap joint plate 1, and said glass plate 25 can support and protect the solar chip set 2 below it to prevent said solar chip set 2 from being damaged by the deformation and stretching of said lap joint plate 1. In addition, said sealant 27 seals said solar chip set 2 between said glass plate 25 and insulating layer 22, so said solar chip set 2 can be prevented from contacting with external moisture to prolong the service life of said solar chip set 2 and improve its safety.

As shown in FIGS. 9 to 12, it is the third embodiment of the present invention, the above-mentioned light-concentrating layer 23 may not be provided on said solar chip set 2, and said insulating layer 22 is replaced with a glass base plate 28 to enhance the overall structural strength of said solar chip set 2. A glass base plate 28 is arranged between said solar chip set 2 and the flat portion 10 of said lap joint plate 1, said glass base plate 28 is respectively stuck to the bottom of said solar chip set 2 and the top of said flat portion 10. The area of said glass base plate 28 is larger the area of said solar chip set 2, and said solar chip set 2 is located in the center of said glass base plate 28. Said solar chip set 2 may be various solar chip set, said solar chip set 2 is provided with a control box 20 and a plurality of output wires 21, said control box 20 is connected to said solar chip set 2 and collects the electricity generated by said solar chip sets 2, the output lines 21 of said adjacent solar chip sets 2 are connected to each other, so that all the solar chip sets 2 can be connected in series, and the electric energy generated by the solar chip sets 2 can be output to an external electrical equipment or an electricity storage equipment.

In the third embodiment, a glass plate 25 is arranged above said solar chip set 2, the area of said glass plate 25 is larger than the area of said solar chip set 2, and said solar chip set 2 is located in the center of said glass plate 25. The bottom of said glass plate 25 is stuck to the top of said solar chip set 2, a sealant 27 is arranged between the outer periphery of said glass plate 25 and the outer periphery of said glass base plate 28, said sealant 27 makes said glass plate 25 and said glass base plate 28 adhere to each other, so that said glass plate 25 and said glass base plate 28 can jointly bear the deformation and stretching of said lap joint plate 1, and said glass plate 25 and said glass base plate 28 can support and protect said solar chip set 2 to prevent said solar chip set 2 from being damaged by the deformation and stretching of said lap joint plate 1. In addition, said sealant 27 seals said solar chip set 2 between said glass plate 25 and glass base plate 28, so said solar chip set 2 can be prevented from contacting with external moisture to prolong the service life of said solar chip set 2 and improve its safety.

As shown in FIGS. 13 to 16, it is the fourth embodiment of the present invention. In this embodiment, a flexible solar chip set 2A is provided, which can cooperate with the deformation and stretching of said lap joint plate 1 to ensure the safety of said flexible solar chip set 2A. Said flexible solar chip set 2A is arranged above said flat portion 10, said flexible solar chip set 2A is provided with a control box 20 and a plurality of output wires 21, said control box 20 is connected to said flexible solar chip set 2A and collects the electricity generated by said flexible solar chip set 2A, the output lines 21 of said adjacent flexible solar chip set 2A are connected to each other, so that all the flexible solar chip set 2A can be connected in series, and the electric energy generated by the solar chip sets 2 can be output to an external electrical equipment or an electricity storage equipment.

In the fourth embodiment, an insulating layer 22 is provided between said flexible solar chip set 2A and the flat portion 10 of said lap joint plate 1, said insulating layer 22 is respectively stuck to the bottom of said flexible solar chip set 2A and the top of said flat portion 10 to avoid direct contact between said flexible solar chip set 2A and flat portion 10. A light-concentrating layer 23 made of fluoropolymer, such as polytetrafluoroethylene (also known as Teflon), is arranged above said flexible solar chip set 2A. The bottom of said light-concentrating layer 23 is stuck to the top of said flexible solar chip set 2A, the area of said light-concentrating layer 23 is larger than the area of said flexible solar chip set 2A, said flexible solar chip set 2A is located in the center of said light-concentrating layer 23, the outer periphery of said light-concentrating layer 23 extends to said flat portion 10 to completely cover said flexible solar chip set 2A. The outer periphery of said light-concentrating layer 23 is stuck to the flat portion 10 of said lap joint plate 1, and said flexible solar chip set 2A is sealed between said light-concentrating layer 23 and the insulating layer 22, so that said flexible solar chip set 2A can be prevented from contacting with external moisture to prolong the service life of said flexible solar chip set 2A and improve its safety. A plurality of light-concentrating grooves 230 are arranged above said light-concentrating layer 23, said light-concentrating grooves 230 make the sunlight irradiated obliquely concentrated on said flexible solar chip set 2A to improve the amount of sunlight and solar energy conversion efficiency of said solar chip set 2.

As shown in FIGS. 17 to 28, various embodiments of said lap joint plate of the present invention are shown. All kinds of lap joint plates for construction can be assembled into one body with said solar chip set 2 or flexible solar chip set 2A.

When a solar power generation facility is to be installed with a plurality of lap joint plates with solar panels, the user only need to lap and combine the protruding portions 11 of the adjacent lap joint plates 1 to each other to quickly complete the connection and assembly. In this way, the adjacent lap joint plates can be firmly combined to form an integrated building structure with high wind pressure resistance, which has the best practicability, safety and economic benefits.

While the preferred embodiments of this invention have been described above, it will be recognized and understood that various modifications may be made therein and appended claims are intended to cover all such modifications that may fall within the spirit and scope of the invention.

What is claimed is:

1. A lap joint plate with solar panel at least comprising:
a lap joint plate, wherein the lap joint plate is provided with one or more flat portions and a plurality of protruding portions, each of said one or more flat portions is arranged between two adjacent protruding portions, a height of said protruding portions are all higher than said one or more flat portions;
one or more solar chip sets are arranged above said one or more flat portions, each of said one or more solar chip sets is provided with a control box and a plurality of output wires, each said control box is connected to a corresponding solar chip set and collects electricity generated by said corresponding solar chip set; an insulating layer is provided between said one or more solar chip sets and the one or more flat portions of said lap joint plate, said insulating layer is respectively stuck to a bottom of said one or more solar chip sets and a top of said one or more flat portions, a light-concentrating layer is arranged above said one or more solar chip sets, a bottom of said light-concentrating layer is stuck to a top of said one or more solar chip sets, a plurality of light-concentrating grooves are arranged above said light-concentrating layer, said light-concentrating grooves make sunlight irradiated obliquely concentrate on said one or more solar chip sets to improve the amount of sunlight of said one or more solar chip sets;
a glass plate is arranged above said light-concentrating layer, an area of said glass plate is larger than an area of said solar chip set and said light-concentrating layer, said solar chip set and said light-concentrating layer are located in a center of said glass plate, and a bottom of said glass plate is stuck to a top of said light-concentrating layer; a sealant is arranged between an outer periphery of said glass plate and each of the one or more flat portions of said lap joint plate, said sealant makes said glass plate and each of the one or more flat portions of said lap joint plate adhere to each other, so that said glass plate directly bears deformation and stretching of said lap joint plate, and said glass plate supports and protects said one or more solar chip sets therebelow it to prevent said one or more solar chip sets from being damaged by the deformation and stretching of said lap joint plate, and said sealant seals said one or more solar chip sets and said light-concentrating layer between said glass plate and said insulating layer, so said one or more solar chip sets are prevented from contacting with external moisture.

* * * * *